(12) United States Patent
Hu et al.

(10) Patent No.: US 8,572,470 B2
(45) Date of Patent: Oct. 29, 2013

(54) MEMORY-EFFICIENT STORAGE METHOD: A FAST BJCR BASED DECODER IMPLEMENTATION SCHEME

(75) Inventors: Jianho Hu, Chengdu (CN); Feng Li, Chengdu (CN); Hong Wen, Chengdu (CN)

(73) Assignee: NXP, B.V., Eindhoven (NL)

( * ) Notice: Subject to any disclaimer, the term of this patent is extended or adjusted under 35 U.S.C. 154(b) by 404 days.

(21) Appl. No.: 12/934,642

(22) PCT Filed: Mar. 27, 2009

(86) PCT No.: PCT/IB2009/051299
§ 371 (c)(1),
(2), (4) Date: Sep. 29, 2010

(87) PCT Pub. No.: WO2009/118713
PCT Pub. Date: Oct. 1, 2009

(65) Prior Publication Data
US 2011/0022926 A1    Jan. 27, 2011

Related U.S. Application Data

(60) Provisional application No. 61/072,185, filed on Mar. 28, 2008.

(51) Int. Cl.
*H03M 13/03* (2006.01)
(52) U.S. Cl.
USPC ............ 714/794; 714/752; 714/786; 714/792
(58) Field of Classification Search
None
See application file for complete search history.

(56) References Cited

U.S. PATENT DOCUMENTS

| | | | | |
|---|---|---|---|---|
| 6,028,899 A * | 2/2000 | Petersen | ........................ | 375/341 |
| 6,226,773 B1 * | 5/2001 | Sadjadpour | ................... | 714/794 |
| 6,606,725 B1 * | 8/2003 | Wang et al. | ................... | 714/755 |
| 6,760,883 B2 * | 7/2004 | Lee | ............... | 714/794 |
| 7,908,545 B2 * | 3/2011 | Hepler et al. | .................. | 714/796 |
| 2008/0104488 A1 * | 5/2008 | Cheng | ........................... | 714/794 |

OTHER PUBLICATIONS

Berrou, Claude, et al; "Near Shannon Limit Error Correcting Coding and Decoding Turbo Codes"; Proceedings ICC 93, vol. 2; Geneva; pp. 1064-1070; (May 1993).
Benedetto, Sergio, et al; "Unveiling Turbo Codes: Some Results N Parallel Concatenated Coding Schemes"; IEEE Trans on Inform Theory, vol. 42, No. 2; pp. 409-428 (Mar. 1996).
Bahl, L. R., et al; "Optimal Decoding of Linear Codes for Minimizing Symbol Error Rate"; IEEE Trans on Inform. Theory, vol. 20, Issue 2; pp. 284-287 (Mar. 1974).
Robertson, Patrick, et al; "A Comparison of Optimal and Suboptimal Map Decoding Algorithms Operation in the Log Domain"; Proc ICC 95, Seattle, WA, US; vol. 2; pp. 1009-1013 (Jun. 1995).

(Continued)

*Primary Examiner* — Albert Decady
*Assistant Examiner* — Justin R Knapp

(57) ABSTRACT

A memory efficient, accelerated implementation architecture for BCJR based forward error correction algorithms. In this architecture, a memory efficiency storage scheme is adopted for the metrics and channel information to achieve high processing speed with a low memory requirement. Thus, BCJR based algorithms can be accelerated, and the implementation complexity can be 5 reduced. This scheme can be used in the BCJR based turbo decoder and LDPC decoder implementations.

9 Claims, 5 Drawing Sheets

(56) References Cited

OTHER PUBLICATIONS

Viterbi, Andrew J.; "An Intuitive Justification and a Simplified Implementation of the Map Decoder for Convolutional Codes"; IEEE Journal on Selected Areas in Communication, vol. 16, No. 2; pp. 260-264 (Feb. 1998).

Chen, Jinghu, et al; "Reduced-Complexity Decoding of LDPC Codes"; IEEE Trans on Communications, vol. 53, No. 8; 31 Pages; (Aug. 2005).

Mansour, Mohammad M., et al; "High-Throughput LDPC Decoders"; IEEE Trans on Very Large Scale Integration Systems, vol. 11; No. 6; (Dec. 2003).

Liu, Ye, et al; "Map Algorithms for Decoding Linear Block Codes Based on Sectionalized Trellis Diagram"; IEEE Transactions on Communciations, vol. 48, No. 4; (Apr. 2000).

International Search Report for Application PCT/IB2009/051299 (Mar. 27, 2009).

\* cited by examiner

MEMORY-EFFICIENT STORAGE METHOD: A FAST BJCR BASED DECODER IMPLEMENTATION SCHEME

This application relates to the field of telecommunications, and more specifically, to a system of forward error correction capable of reducing errors in received data.

Reliable data transmission is an important issue for wireless transmission systems. forward error correction (FEC) schemes are widely used to improve the reliability of wireless systems. In recent years, some close to Shannon limit FEC schemes, such as Turbo codes and low density parity check (LDPC, have been adopted in high data rate systems. Many of these schemes include decoders that utilize the BCJR algorithm, proposed by Bahl, Cocke, Jelinek and Raviv in "Optimal Decoding of Linear Codes for Minimizing Symbol Error Rate," IEEE Trans. Inform. Theory, Mar. 1974, vol. IT-20, No. 2, pp. 284-287, the disclosure of which is incorporated herein by reference. The BCJR algorithm is a modified Maximum A Posteriori (MAP) algorithm. The objective of the BCJR algorithm is to obtain a good guess of the bit probabilities. These probabilities include systematic information and extrinsic information. The performance of the decoder is close to the Shannon limit.

Although the performance of the BCJR algorithm is near optimal, integrated circuit implementations of the BCJR based algorithm face two main challenges: latency and a large memory requirement.

Upon receiving a data frame fed into the BCJR algorithm based decoder, the decoder works in an iterative way. For each iteration, the decoder at first checks the data frame and extrinsic information generated in the previous iteration from head to tail and then from tail to head to collect decoding information. Based on the collected information, the decoder estimates the most likely possible input data. The estimation is fed back to the other decoder for the next iteration. This means that the BCJR based decoder must process the data from the beginning of the data frame to the end and then back before estimations are made during the iteration processing. After a certain number of iterations, the result of extrinsic information converges, and the process stops. For a data frame of n bits, the forward and backward information getting step takes 2n substeps, and the estimation step needs n substeps. Hence, latency of the BCJR algorithm is high. The BCJR decoder has to keep all of the decoding information until the extrinsic information is generated, and the extrinsic information must be stored for the next iteration. For a data frame of n bits and the turbo code space of S, 2×n×S memory units are needed to keep the information. So the memory requirement is large for the maximum a posteriori (MAP) algorithm.

In exemplary embodiments according to the present invention, a memory-efficient storage method (MESM) with module normalization and embedded storage technology is provided for the BCJR based decoder implementation to reduce memory requirements and speed up the decoder. MESM can be used to design Turbo and low-density parity check (LDPC) decoders.

The accompanying drawings, together with the specification, illustrate exemplary embodiments of the present invention, and, together with the description, serve to explain the principles of the present invention.

Figure 1:
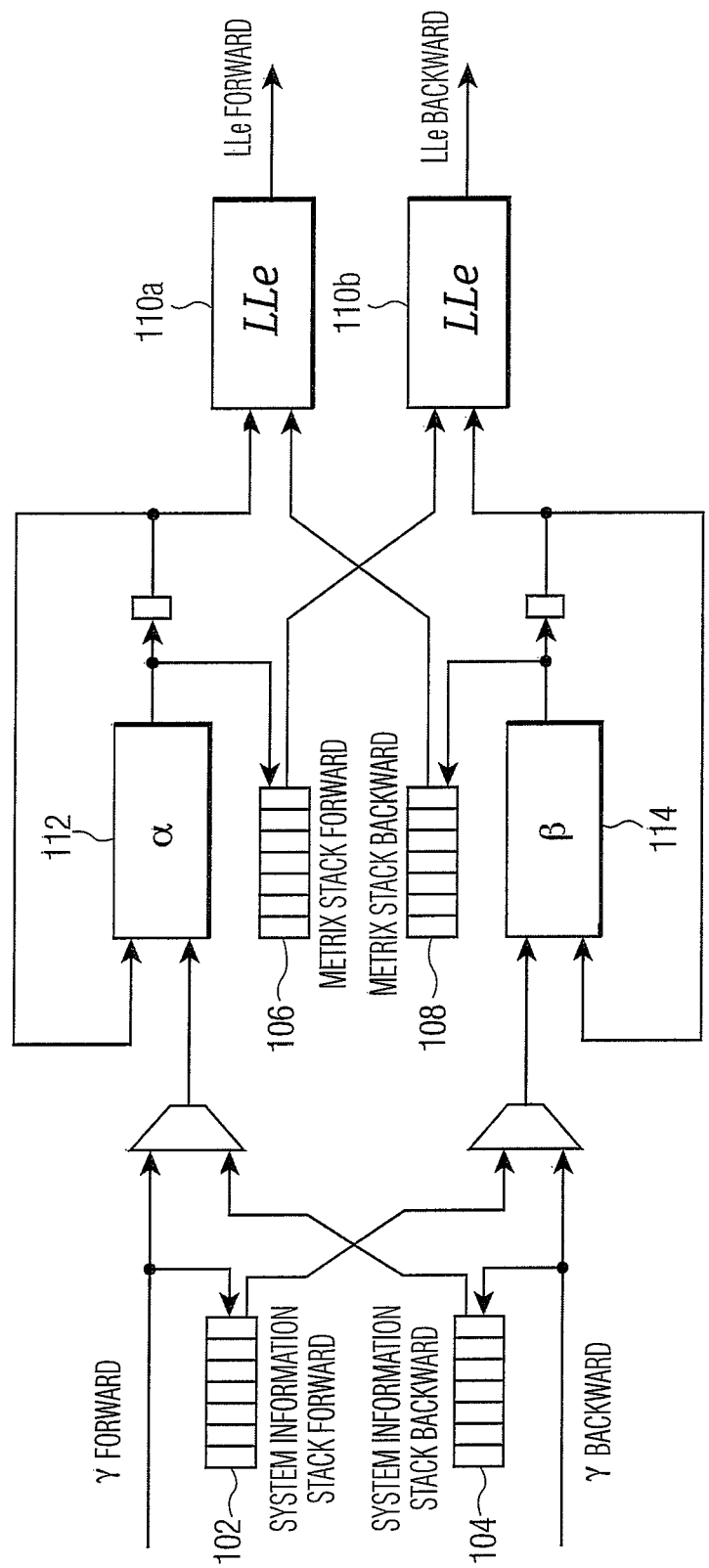
FIG. 1 is a block diagram illustrating an exemplary implementation scheme for MESM.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

A memory-efficient storage method (MESM) uses a shared memory storage scheme to reduce the memory requirement for the Bahl-Cocke-Jelinek-Raviv (BCJR) algorithm and a two-way metrics update method to update metrics information and produce the extrinsic information to speed up the iterative decoding procedure.

In MESM, a shared storage scheme is used for the metrics information and system information, which is shown as the stacks 102, 104, 106, and 108 in FIG. 1. According to a metrics information sharing scheme, forward and backward metrics information updates in the BCJR algorithm can be performed in parallel, and extrinsic information for the next iteration can be calculated with the metrics update. The metrics can be updated with module normalization (discussed below) and stored with embedded storage technology. Thus, the processing of the BCJR based decoder is sped up and memory is reduced significantly. With the help of a system information sharing scheme, the computation load for the system information is half of the traditional method. Therefore, the BCJR based decoding algorithm can be simplified.

For convenience, the following table defines some of the main symbols used in this document.

| | |
|---|---|
| $\alpha_k$ | The metrics of the MAP decoder in forward direction at kth step |
| $\beta_k$ | The metrics of the MAP decoder in reverse direction at kth step |
| $LLe_k$ | The extrinsic information of the MAP decoder for the kth symbol |
| S | The state space of the turbo code |
| $x_k$ | The kth symbol at the decoding path |
| $y_k$ | The kth parity code word at the decoding path |
| ds | The kth symbol fed into the decoder |
| dp | The kth parity code word fed into the decoder |
| $s^+$ | The sub-collection of the states transfer from s' to s, (s' → s), when $x_k = +1$ |
| $s^-$ | The sub-collection of the states transfer from s' to s, (s' → s), when $x_k = -1$ |
| length | The length of data frame for decoder |

The following example illustrates some of the underlying ideas of the BJCR algorithm. Assume an archaeologist finds a letter written by his ancestors hundreds of years ago. Some words on the letter have become unrecognizable due to the age of the letter, but the archaeologist can guess the unrecognizable words utilizing relationships among the words. He can guess the unrecognizable words more easily and correctly within a paragraph than he can with a single sentence. If there are enough useful words on the letter, the archaeologist can get all of the information that his ancestors wanted to tell.

Figure 2:
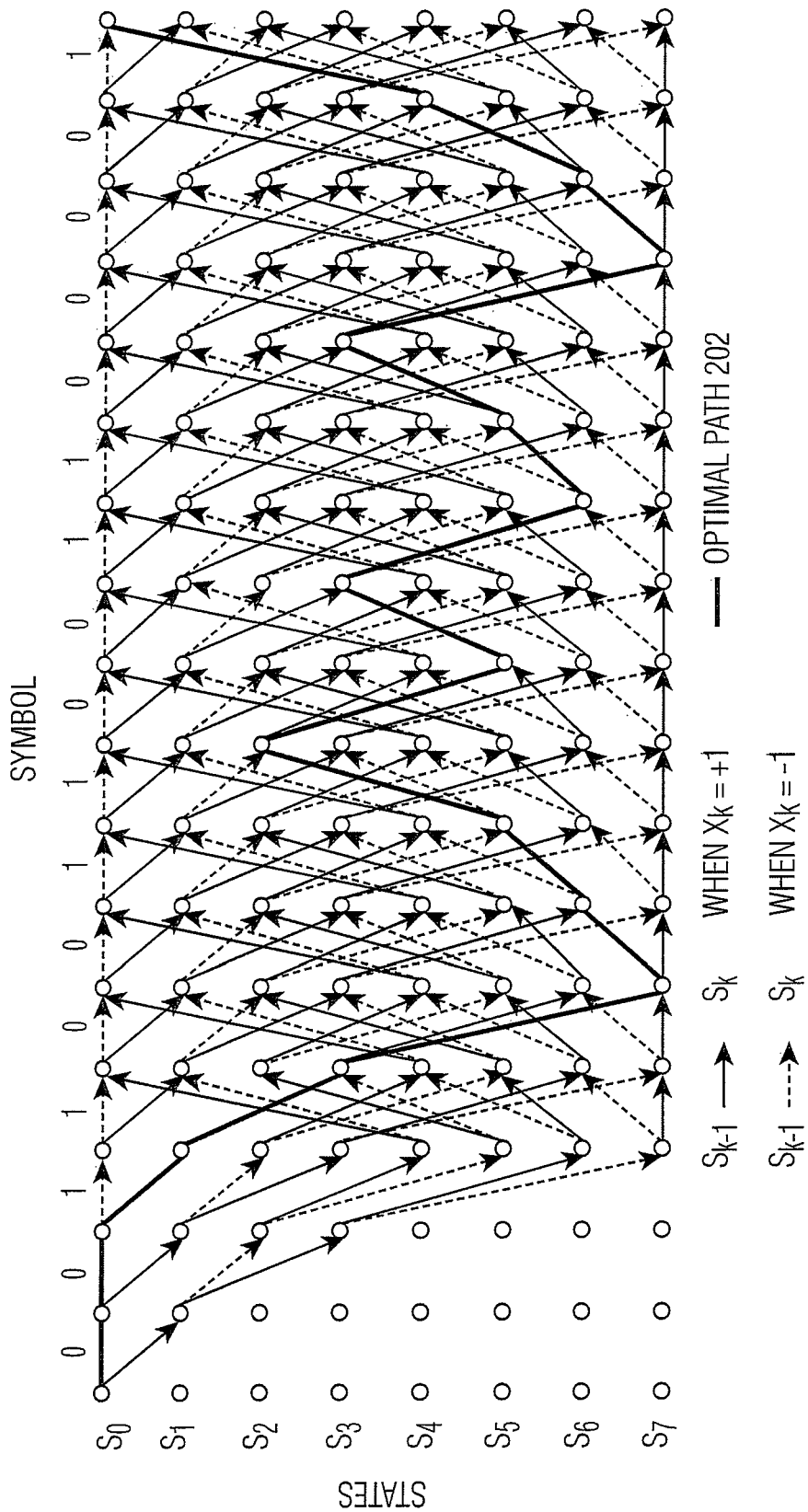
FIG. 2 is a trellis graph illustrating an exemplary decoding path.

The BCJR algorithm works in a similar manner by adding redundant bits into the source data with the relationship encoding algorithm. The source data and the redundant bits are transmitted together. The receiver gets a noisy version of the sent data. The BCJR based decoder scans the received data from head to tail to recognize the relationship forward metrics, and scans the data from tail to head to recognize the relationship backward metrics. Then, the decoder utilizes the metrics to determine the optimal decoding path from all possible paths. The optimal path is the best guess for all inputted data. For example, as illustrated in FIG. 2, a data frame of length=15 is fed into the BCJR based decoder. The state space of the code, S, is 8; and the optimal decoding path 202 is shown in FIG. 2.

According to the BCJR based decoder architecture illustrated in FIG. 1, the output of each decoder is the probability distribution for each bit in the frame. A common tool to express the bit probabilities in bit decoding is based on the Log Likelihood Ratio (LLR). The LLR of the $k^{th}$ bit is defined by:

$$LLR(s_k) = \log \frac{P(c_k = 1/X)}{P(c_k = 0/X)} = \frac{\sum_{s^+} \alpha_{k-1}(s')\gamma(s', s)\beta_k(s)}{\sum_{s^-} \alpha_{k-1}(s')\gamma(s', s)\beta_k(s)} \quad (1)$$

where $s \in S$, $s' \in S$, and $c_k$ is the value of the $k^{th}$ bit in the transmitted codeword. X is the received vector. $\alpha_{k-1}$ is the $k-1^{th}$ forward metrics. $\beta_k$ is the $k^{th}$ backward metrics. $\gamma_k(s', s)$ is the probability that system state transforms from the s' state at the $k-1^{th}$ step to the s state at the $k^{th}$ step.

According to an exemplary embodiment, as illustrated in FIG. 1, the metrics update can be performed by forward metric update block 112 and backward metric update block 114 as follows. In the forward direction, $\alpha_k = (\alpha^0_k, \alpha^1_k, \ldots, \alpha^{s-1}_k)$ is obtained with $\alpha_{k-1}$. In the backward direction, $\beta_k = (\beta^0_k, \beta^1_k, \ldots, \beta^{s-1}_k)$ is obtained with $\beta_{k+1}$.

$$\alpha_k(s) = \frac{\sum_{s'} \alpha_{k-1}(s')\gamma_k(s', s)}{\sum_s \sum_{s'} \alpha_{k-1}(s')\gamma_k(s', s)} \quad (2)$$

$$\beta_{k-1}(s) = \frac{\sum_s \beta_k(s)\gamma_k(s', s)}{\sum_s \sum_{s'} \alpha_{k-1}(s')\gamma_k(s', s)} \quad (3)$$

where $s \in S$, $s' \in S$, $\alpha_0$ and $\beta_{length}$ are known, and probability $\gamma_k(s', s)$ is defined as:

$$\gamma_k(s', s) = p(s_k = s/s_{k-1} = s')$$
$$= \exp\left[\frac{1}{2}x_k(LLe_k + L_c ds^s_k) + \frac{1}{2}L_c dp_k Y_k\right]$$
$$= \exp\left[\frac{1}{2}x_k(LLe_k + L_c ds^s_k)\right] + \gamma^e_k(s',$$

The extrinsic information, $LLe_k$, is computed by extrinsic calculation blocks 110a and 110b utilizing $\alpha_{k-1}$ and $\beta_k$:

$$LLe_K = \frac{\sum_{s^+} \alpha_{k-1}(s')\gamma^e(s', s)\beta_k(s)}{\sum_{s^-} \alpha_{k-1}(s')\gamma^e(s', s)\beta_k(s)} \quad (4)$$

Where $s \in S$ and $s' \in S$.

Figure 3:
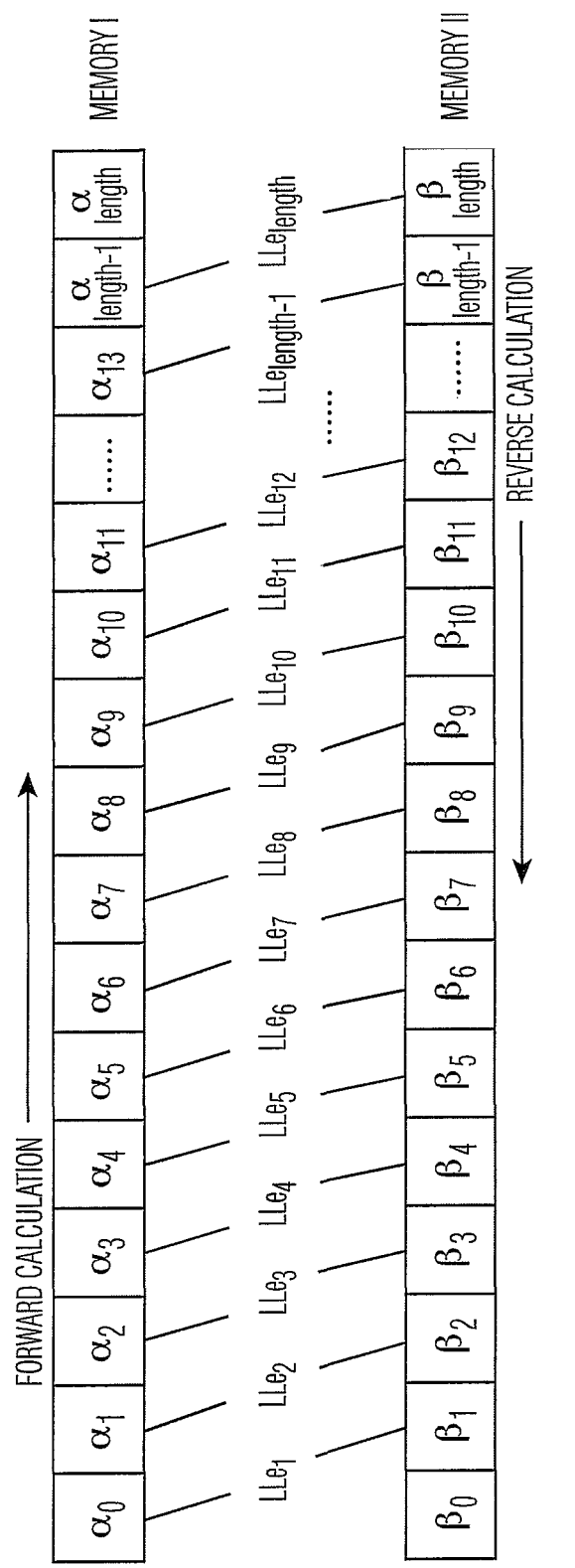
FIG. 3 is a diagram illustrating a metric calculation.

The procedure of the metrics update according to one exemplary embodiment is shown in FIG. 3. According to equations (1)-(4), the metrics in the forward direction, $\alpha_{k-1}$, and in the reverse direction, $\beta_k$, should be kept until $LLe_k$ or $LLR_k$ is calculated. Thus, the memory requirement, M, is:

$M = 2 \times length \times S$.

Equations (1)-(4) illustrate three truths. The first is that a metrics update can be performed independently in the forward and backward directions, since $\alpha$ can be computed without the information of $\beta$, and vice versa. The second is that $\alpha_{k-1}$ is used in two cases: one for updating $\alpha_k$ and another for calculating $LLe_k$. A similar case exists for $\beta_k$. We also find that $\alpha_{k-1}$ and $\beta_k$ are useless after $LLe_k$ is obtained from FIG.

2. The third is that each $\gamma_k(s', s)$ is used two times: once for the forward update and again for the backward update. Thus, $\gamma_k(s', s)$ can be calculated once and stored for two uses. Thus, a novel metrics update and storage scheme is proposed to speed up the BCJR based algorithm. This scheme is referred as a memory-efficient storage method (MESM). Due to the calculation independence of the metric updating, the memory can be shared for the forward and backward metrics storage, and metrics updating can be performed simultaneously for the forward and backward directions in MESM. The system information, $\gamma_k(s', s)$, is shared by the forward and backward update. The MESM can reduce the computation complexity of the BCJR algorithm.

In MESM, the same memory can be shared by forward and reverse metrics, $\alpha$ and $\beta$, and the BCJR based decoder performs the extrinsic and metrics computations at the same time. The procedure of MESM is as follows.

The initial forward and reverse metric information, $\alpha_0$ and $\beta_{length}$, is stored at the head ($M_0$) and tail ($M_{length}$) of the same memory space. Let $k_f = 0$ and $k_r = length$, where length is an odd number. Let $$h = \frac{length - 1}{2}.$$

In the forward direction, read ($M_{kf}$) and ($M_{kf+1}$) as $\alpha_{kf}$ and $\beta_{kf+1}$ respectively. Calculate $\alpha_{kf+1}$ with $\alpha_{kf}$, $LLe_{kf+1}$ with $\alpha_{kf}$ and $\beta_{kf+1}$. In the backward direction, read ($M_{kr-1}$) and ($M_{kr}$) as the $\alpha_{kr-1}$ and $\beta_{kr}$ respectively, calculate $\beta_{kr-1}$ with $\beta_{kr}$, $LLe_{kr}$ with $\alpha_{kr-1}$ and $\beta_{kr}$. Then, store $\alpha_{kf+1}$ and $\beta_{kr-1}$ in ($M_{kf+1}$) and ($M_{kr-1}$) respectively. $\gamma_{kf+1}$ and $\gamma_{kr-1}$ are pushed in the stacks for the forward and backward directions, respectively. When $k_f > h$, $\gamma_{kf+1}$ and $\gamma_{kr-1}$ are popped out of the stacks for the $\alpha_{kf+1}$, $\beta_{kr}$, $LLe_{kf+1}$ and $LLe_{kr}$ calculation. $LLe_{kf+1}$ and $LLe_k$ are outputted as useful extrinsic information, otherwise $LLe_{kf+1}$ and $LLe_{kr}$ are discarded.

$k_f = k_f + 1$ and $k_r = k_r - 1$. Return to 2 until $K_r = 1$.

Figure 4:
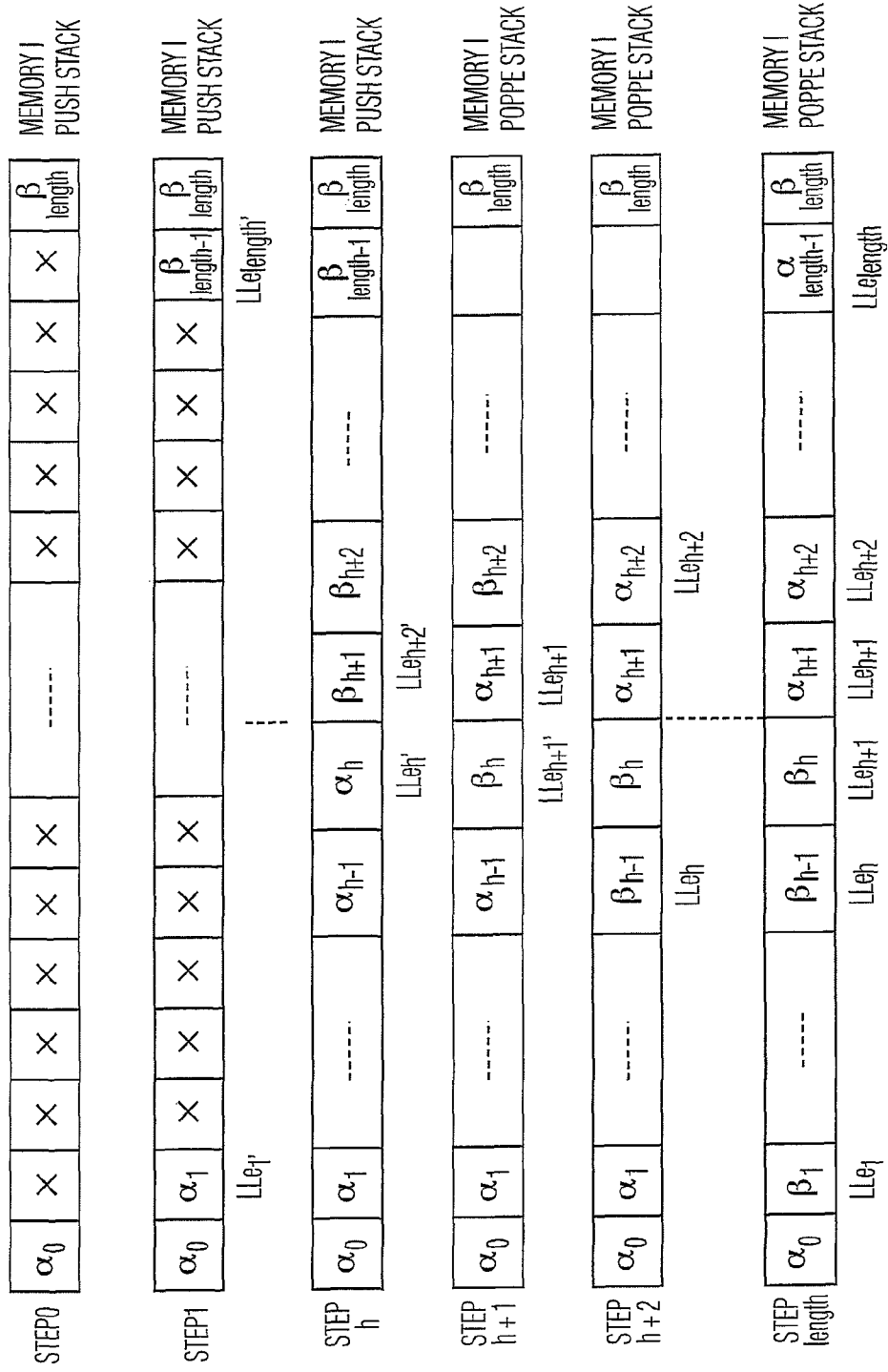
FIG. 4 is a diagram illustrating the metrics update method of MESM.

FIG. 4 shows the metrics update method of MESM. At the initial time, step0, $\alpha_0$ and $\beta_{length}$ are stored in the head and tail of the memory space. The new forward metrics $\alpha_1$ and $LLe_1$ are obtained at the end of step1. $LLe_1$, denoted $LLe_1'$ in FIG. 4, may be useless because the content of the $2^{nd}$ memory unit ($M_1$) is meaningless at step1. After step1, $\alpha_1$ is stored in ($M_1$) for calculation of $LLe_1$ in the future, and $LLe_1'$ is discarded. $\beta_{length-1}$ is stored in ($M_{length-1}$) calculation of $LLe_{length-1}$ in the future, and $LLe'_{length-1}$ is discarded. After h steps, $\alpha_0$, $\alpha_1, \ldots, \alpha_h$ are stored in ($M_0$), ($M_1$), ..., ($M_h$) respectively, and $\beta_{h+1}, \beta_{h+2}, \ldots, \beta_{length}$ are stored in ($M_{h+1}$), ($M_h2$), ..., ($M_{length}$), respectively. At the end of step h+1, a reasonable $LLe_{h+1}$ can be obtained in the forward direction, since the available $\beta_{h+1}$ in ($M_{h+1}$) can be found at the beginning of step h+1. In the reverse direction the available $\alpha_h$ in ($M_h$) can be found at the beginning of step h+1. Now, an interesting thing happens: $\alpha_h$ and $\beta_{h+1}$ become useless, because $LLe_{h+1}$, $\alpha_{h+1}$, and $\beta_h$ are calculated at the end of step h+1. Thus, $\alpha_h$ and $\beta_{h+1}$ in the memory can be overwritten with $\beta_h$ and $\alpha_{h+1}$, respectively. At the end of step h+2, $\alpha_{h+2}$ and $LLe_{h+2}$ will be obtained in the forward direction, and $\beta_{h-1}$ and $LLe_h$ in the reverse direction, and $\alpha_{h-1}$ and $\beta_{h+2}$ in the memory can be replaced with $\beta_{h-1}$ and $\alpha_{h+2}$, respectively. So, all of the extrinsic information will be obtained at the end of step length. In MESM, length memory is used for the $\gamma_k(s', s)$ storage. Thus the memory requirement for MESM is:

$M = length \times (S+1)$.

That is only half of the traditional method. All of the extrinsic information is obtained as soon as the metrics calculation is complete. According to FIG. 3, when the metrics update is finished, all of the extrinsic information of the BCJR decoder has been calculated. Thus, length substeps are needed in MESM instead of 3×length in the traditional method. Thus, the proposed scheme can also help to speed up each iteration.

In MESM, if length is odd, the metrics are updated as illustrated in FIG. 3. If the data frame length is even, an additional symbol according to the initial state of encoder should be added at the end of the tail to perform the proposed method directly. Because the turbo encoder will return to initial state at the end of encoding for every data frame, the additional symbol will not cause any errors for the BCJR decoder.

According to the ideal BCJR algorithm, metrics at each step is a set of numbers between 0 and negative infinity (0 to the bound of the negative numbers in practice). The metric of one state closer to 0 means the state is the correct state on the optimal decoding path with higher probability. If $\alpha_k(s)$ is the maximum, $\alpha_k(s)=0$, s is the correct state with the highest probability at the $k^{th}$ step in the forward direction. If $\beta_k(s)$ is the maximum, $\beta_k(s)=0$, s is the correct state with the highest probability at the $k^{th}$ step in the reverse direction.

Figure 5:
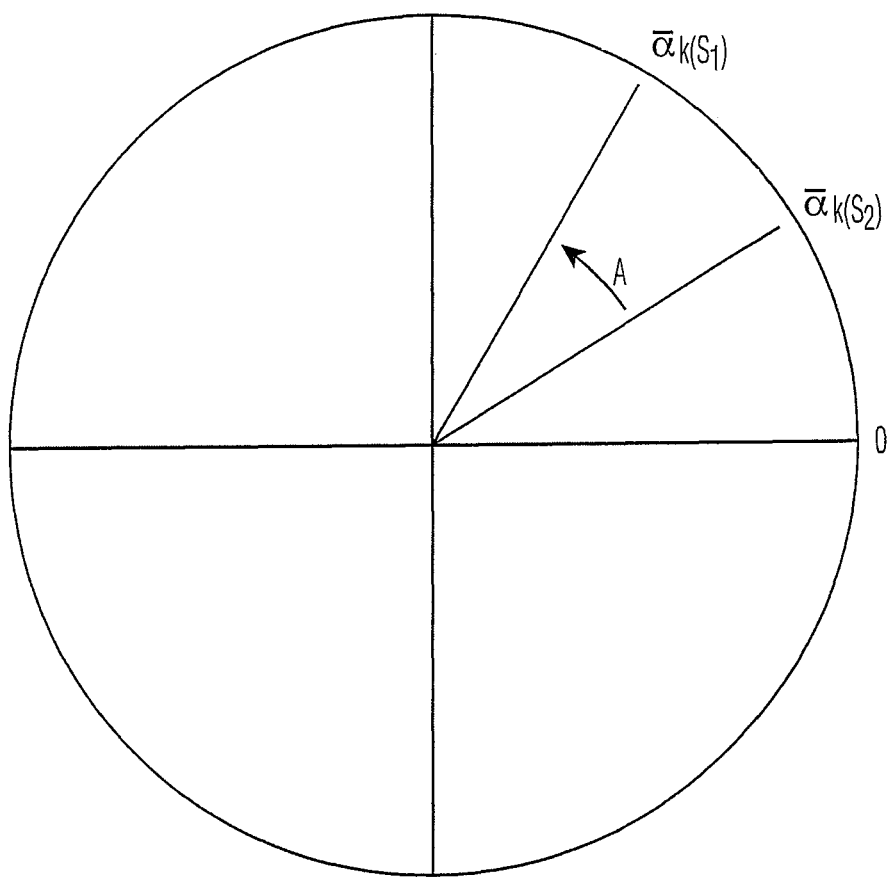
FIG. 5 is a diagram illustrating module normalization.

According to an exemplary embodiment of the present invention, module normalization can be used for the metrics update. In module normalization, the metrics, for example $\alpha_k$, are replaced by the normalized $\overline{\alpha}_k(s)=\mod\{\alpha_k(s), C\}$, as in FIG. 5. It should be noted that $-C<\overline{\alpha}_k(s)<C$. We can think of the quantities $\{\overline{\alpha}_k(s)\}$ as positions on the modular circle with radius $$\frac{C}{\pi},$$

with angle $$\frac{\pi\overline{\alpha}_k(s)}{C}.$$

Let $\alpha_k(s_1)$ and $\alpha_k(s_2)$ be real numbers with $|\alpha_k(s_1)-\alpha_k(s_2)|<C$. Let A be the angle swept out by counter clockwise motion along the arc from $\overline{\alpha}_k(s_2)$ to $\overline{\alpha}_k(s_1)$, then:

$\alpha_k(s_1) > \alpha_k(s_2)$, if and only if $A<\pi$.

This proposition can be interpreted in less mathematical terms when thinking of $\alpha_k$ as runners in a race. If all the runners are running in one half the circle at all times (a very competitive race), it is very easy to determine who is the leader. Therefore, if the difference between $\alpha_k$ is always less than half of the modular circle, the maximum of $\alpha_k$ can be easily found regardless of the absolute position on the circle.

In module normalization, the modular arithmetic can be implemented by 2's-complement adders and subtractors. Let the 2's complement data range used in intelligent normalization be (−C, C). According to (6a) and (7a) in the log_MAP algorithm, the normalization is already performed, if the following relationships are satisfied:

max $A_k(s)$−min $A_k(s)<C$, and max $B_k(s)$−min $B_k(s)<C$.

The normalization in the BCJR can be simplified with module normalization.

If $\{\alpha_{k-1}(s')\}$ and $\{\beta_k(s)\}$ are obtained with module normalization, the contribution of the maximum of $\{\alpha_{k-1}(s')\}$ and the maximum of $\{\beta_k(s)\}$ will be maintained. The same result will be obtained with (2-3), if 2's complement calculation is used, and the following relationships are satisfied:

$|\max P_k^+ - \max P_k^-|<C$;

$\max P_k^+ - \min P_k^+ <C$; and $\max P_k^- - \min P_k^- <C$, where:

$\max P_k^+ = \max_{s \in S}^+\{P_k(s)\}$, $\min P_k^+ = \min_{s \in S}^+\{P_k(s)\}$; and $\max P_k^- = \max_{s \in S}^-\{P_k(s)\}$, $\min P_k^- = \min_{s \in S}^-\{P_k(s)\}$.

Therefore, the procedure of finding the maximum metric is not needed. The process of BCJR at every step is simplified, and metrics update is sped up.

The penalty of the module normalization is the extra bit required to perform modular normalization. The bit width of module normalization can be determined with $|\max P^+ - \max P^-|<C$ in the BCJR algorithm.

According to the ideal of module normalization, the metrics are moved to new places where $\alpha_k(0)$ and $\beta_k(0)$ always equal 0. Thus, $\{\alpha(0)\}=\{\alpha_0(0), \alpha_1(0), \ldots, \alpha_{length}(0)\}$ and $\{\beta(0)\}=\{\beta_0(0), \beta_0(0), \ldots, \beta_{length}(0)\}$ need not be stored in the memory. This technique may be referred to as embedded storage. It can reduce the memory requirement.

Since $\alpha_k(0)$ and $\beta_k(0)$ are always 0 during the metrics and extrinsic information calculation, the operations using them can be omitted. Thus, embedded storage will not increase the computation load.

If the sliding window method is adopted in the implementation of the BCJR algorithm, MESM can also be used. The implementation block diagram of MESM is shown in FIG. 1.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of decoding a turbo code by a decoder implementing the Balh-Cocke-Jelinek-Raviv (BCJR) algorithm, the method comprising:
   a) iteratively calculating forward metrics and backward metrics according to maximum a posteriori (MAP) type algorithm;
   b) storing each of the forward metrics as they are calculated in sequence beginning from a head position of a memory unit having a plurality of storage locations equal in number to a length of the turbo code, wherein the plurality of storage locations are initially unloaded with any of the forward metrics or the backward metrics;
   c) storing each of the backward metrics as they are calculated in sequence beginning from a tail position of the memory unit;
   d) after a number of the forward metrics and a number of the backward metrics fill up all of the initially unloaded storage locations of the memory unit, iteratively calculating a plurality of extrinsic information corresponding to the forward metrics and the backward metrics stored in the memory unit,
   wherein at least one of the forward metrics already used for calculating its corresponding one of the plurality of extrinsic information is overwritten in its corresponding storage location by one of the backward metrics calculated after the at least one of the forward metrics, and
   wherein at least one of the backward metrics already used for calculating its corresponding one of the plurality of extrinsic information is overwritten in its corresponding storage location by one of the forward metrics calculated after the at least one of the backward metrics.

2. The method of claim 1, wherein an additional symbol according to an initial state of the decoder is added to the tail of the turbo code before the turbo code is decoded.

3. The method of claim 1, wherein the forward metrics and backward metrics each comprise normalized metrics.

4. The method of claim 1, wherein the forward metrics are calculated independently from the backward metrics.

5. The method of claim 1, wherein said iteratively calculating forward metrics and backward metrics comprise calculating a plurality of system information each corresponding to a corresponding pair of one the forward metrics and one of the backward metrics.

6. The method of claim 5, wherein each of the plurality of system information is calculated once and used for the calculation of the corresponding one of the forward metrics and the corresponding one of the backward metrics.

7. A method of decoding a received message comprising L symbols according to a BCJR MAP algorithm, the method comprising:

calculating forward metrics $\alpha_k$ corresponding to metrics of the MAP decoder in a forward direction at a $k^{th}$ step, according to an equation:

$$\alpha_k(s) = \frac{\sum_{s'} \alpha_{k-1}(s')\gamma_k(s', s)}{\sum_{s}\sum_{s'} \alpha_{k-1}(s')\gamma_k(s', s)},$$

wherein s∈S, and s'∈S, wherein S is a state space of a turbo code, and wherein $\alpha_0$ is known, and probability $\gamma_k(s', s)$ is defined as:

$$\gamma_k(s', s) = p(s_k = s / s_{k-1} = s')$$
$$= \exp\left[\frac{1}{2}x_k(LLe_k + L_c ds_k^s) + \frac{1}{2}L_c dp_k Y_k\right]$$
$$= \exp\left[\frac{1}{2}x_k(LLe_k + L_c ds_k^s)\right] + \gamma_k^e(s', s),$$

wherein $x_k$ is a $k^{th}$ symbol at a decoding path, $\gamma_k$ is a $k^{th}$ parity code word at a decoding path, $LLe_k$ is extrinsic information of the MAP decoder for the $k^{th}$ symbol, dp is a $k^{th}$ parity code word fed into the decoder, and ds is a $k^{th}$ symbol fed into the decoder;

calculating backward metrics $\beta_{k-1}$ corresponding to metrics of the MAP decoder in a reverse direction at the $k^{th}$ step, according to an equation:

$$\beta_{k-1}(s) = \frac{\sum_{s} \beta_k(s)\gamma_k(s', s)}{\sum_{s}\sum_{s'} \alpha_{k-1}(s')\gamma_k(s', s)},$$

wherein $\beta_L$ is known;

storing the forward metrics $\alpha_k$ as they are calculated, in sequence beginning at a head of a memory stack, the memory stack comprising memory units $M_0$, $M_1$, $M_2$, ..., $M_L$ from head to tail, respectively;

storing backward metrics $\beta_k$ as they are calculated, in reverse sequence beginning at the tail of the memory stack;

after h+1 forward metrics $\alpha_0$–$\alpha_h$ and h backward metrics $\beta_L$–$\beta_{h+1}$ are stored in the memory stack, wherein h=(L−1)/2, calculating extrinsic information $LLe_k$ according to an equation:

$$LLe_k = \frac{\sum_{s^+} \alpha_{k-1}(s')\gamma^e(s', s)\beta_k(s)}{\sum_{s^-} \alpha_{k-1}(s')\gamma^e(s', s)\beta_k(s)},$$

wherein $s^+$ corresponds to a sub-collection of the states transfer from s' to s, (s'→s), when $x_k$=+1, and wherein $s^-$ corresponds to a sub-collection of the states transfer from s to s', (s→s'), when $x_k$=−1;

storing further forward metrics $\alpha_{h+1}$–$\alpha_L$ in sequence in the memory stack to overwrite the backward metrics stored in those spaces after the extrinsic information $LLe_k$ is calculated using those backward metrics; and storing further backward metrics $\beta_h$–$\beta_0$ in reverse sequence in the memory stack to overwrite the forward metrics stored in those spaces after the extrinsic information $LLe_k$ is calculated using those forward metrics.

8. The method of claim 7, further comprising adding an additional symbol according to an initial state of an encoder at the end of a tail of the received message when L is an even number.

9. The method of claim 7, wherein:
the forward metrics $\alpha_k$ comprise normalized $\overline{\alpha}_k(s)$=mod$\{\alpha_k(s), C\}$, wherein quantities $\{\overline{\alpha}_k(s)\}$ are positions on a modular circle with radius $$\frac{C}{\pi},$$

with angle $$\frac{\pi\overline{\alpha}_k(s)}{C};$$

and the backward metrics $\beta_k$ comprise normalized $\overline{\beta}_k(s)$=mod$\{\beta_k(s), C\}$, wherein quantities $\{\overline{\beta}_k(s)\}$ are positions on the modular circle with radius $$\frac{C}{\pi},$$

with angle $$\frac{\pi\overline{\beta}_k(s)}{C}.$$

* * * * *